(12) United States Patent
Liu et al.

(10) Patent No.: US 11,718,788 B2
(45) Date of Patent: Aug. 8, 2023

(54) RED LIGHT AND NEAR-INFRARED LIGHT-EMITTING MATERIAL AND LIGHT-EMITTING DEVICE

(71) Applicant: GRIREM ADVANCED MATERIALS CO., LTD, Beijing (CN)

(72) Inventors: Ronghui Liu, Beijing (CN); Yuanhong Liu, Beijing (CN); Xiaoxia Chen, Beijing (CN); Xiaole Ma, Beijing (CN); Yuan Xue, Beijing (CN); Tongyu Gao, Beijing (CN)

(73) Assignee: GRIREM ADVANCED MATERIALS CO., LTD, Beijing (CN)

( * ) Notice: Subject to any disclaimer, the term of this patent is extended or adjusted under 35 U.S.C. 154(b) by 0 days.

(21) Appl. No.: 17/254,225

(22) PCT Filed: Jul. 9, 2019

(86) PCT No.: PCT/CN2019/095239
§ 371 (c)(1),
(2) Date: Dec. 18, 2020

(87) PCT Pub. No.: WO2021/003665
PCT Pub. Date: Jan. 14, 2021

(65) Prior Publication Data
US 2022/0119704 A1     Apr. 21, 2022

(30) Foreign Application Priority Data
Jul. 9, 2019   (CN) .......................... 201910614525.7

(51) Int. Cl.
*C09K 11/77*   (2006.01)
*H01L 33/26*   (2010.01)
*H01L 33/50*   (2010.01)

(52) U.S. Cl.
CPC ...... *C09K 11/7734* (2013.01); *C09K 11/7792* (2013.01); *H01L 33/26* (2013.01); *H01L 33/502* (2013.01)

(58) Field of Classification Search
CPC .................. C09K 11/7734; C09K 11/7792
See application file for complete search history.

(56) References Cited

U.S. PATENT DOCUMENTS

2021/0155850 A1* 5/2021 Tanno ................ C01G 37/14

FOREIGN PATENT DOCUMENTS

CN        107674673        * 10/2017

OTHER PUBLICATIONS

Li, L., Wei, W., & Behrens, M. (2012). Synthesis and characterization of α-, β-, and γ-Ga$_2$O$_3$ prepared from aqueous solutions by controlled precipitation. Solid State Sciences, 14(7), 971-981. doi:10.1016/j.solidstatesciences.2012.04.037. (Year: 2012).*

(Continued)

*Primary Examiner* — Matthew E. Hoban

(57) ABSTRACT

The present invention discloses a red light and near-infrared light-emitting material and a light-emitting device. The red light and near-infrared light-emitting material contains a compound represented by a molecular formula, xA$_2$O$_3$·yIn$_2$O$_3$·bR$_2$O$_3$, wherein the element A is Sc and/or Ga; the element R is one or two of Cr, Yb, Nd or Er and necessarily includes Cr; and 0.001≤x≤1, 0.001≤y≤1, 0.001≤b≤0.2, and 0.001≤b/(x+y)≤0.2. The light-emitting material can be excited by a technically mature blue light source to emit light with a high-intensity wide-spectrum or multiple spectra. Compared with existing materials, the light-emitting material has higher luminescent intensity. The light-emitting device uses an LED chip to combine an infrared light-emitting material and a visible light light-emitting material. In this way, the same LED chip can emit (Continued)

near-infrared light and visible light at the same time, which greatly simplifies the packaging process and reduces the packaging cost.

13 Claims, 2 Drawing Sheets

(56) References Cited

OTHER PUBLICATIONS

Vasil'tsiv.UV Excitation Bandsand Thermoluminescence of (Gal. xlnx)2O3 Solid Solutions. Journal of Applied Spectroscopy, vol. 58, Nos. 3-4, 1993 (Year: 1993).*

* cited by examiner

RED LIGHT AND NEAR-INFRARED LIGHT-EMITTING MATERIAL AND LIGHT-EMITTING DEVICE

CROSS-REFERENCE TO RELATED APPLICATIONS

This Application is a national stage application of PCT/CN2019/095239. This application claims priorities from PCT Application No. PCT/CN2019/095239, filed Jul. 9, 2019, and from the Chinese patent application 201910614525.7 filed Jul. 9, 2019, the content of which is incorporated herein in the entirety by reference.

TECHNICAL FIELD

The embodiments of the present invention relate to the field of light-emitting materials, in particular to a red light and near-infrared light-emitting material and a light-emitting device, and more particularly to a material capable of generating high-efficiency emission of red light and near-infrared light under the excitation of purple light, blue light and red light and to a white light and near-infrared light-integrated light-emitting device manufactured by using this material and mixing with other light-emitting materials.

BACKGROUND

In recent years, the applications of near-infrared light in such fields as security monitoring, biometrics, 3D sensing, and food/medical detection have become a focus at home and abroad. For example, a wide spectrum from 650 nm to 1050 nm covers frequency doubling and combining characteristic information of vibrations of hydrogen-containing groups (O—H, N—H, C—H) and can be widely used in the field of food detection. Wide spectra from 850 nm to 1000 nm and from 1400 nm to 1700 nm or multiple spectra can be applied to the fields of medical detection and biological recognition. In particular, with the continuous increase of demands for social security, the demands for LED near-infrared light sources with a range of wavelengths from 750 nm to 940 nm in the field of security monitoring are steadily increased.

At present, the main implementation method of near-infrared LEDs is to use near-infrared semiconductor chips. For example, infrared chips with wavelengths of 850 nm and 940 nm are mainly used in the security field. In order to compensate for light in the process of detection at night, or to achieve an effect of color display, one or more additional white-light LEDs are usually used at the same time. In the implementation method, since the price of the near-infrared LED chip is relatively high and a plurality of chips is used at the same time for packaging, the process is complicated, so that the cost is relatively high, which limits the application and promotion of the near-infrared LED optical devices.

However, the near-infrared LED using a visible-light chip to combine a near-infrared light-emitting material has the advantages of simple manufacturing process, low cost, high luminous efficiency and the like. Moreover, the near-infrared light-emitting material has wide emission wavelengths, which can realize various specific wavelengths of multiple near-infrared applications and easily achieve the integration of white light and near-infrared light by simultaneously combining visible light light-emitting materials. The packaging process is relatively simple, so that the problem of a complex packaging process encountered in the white light compensation process can be solved.

In the existing disclosed patents or non-patent literature reports, there is still a lack of materials, which can be excited by near-ultraviolet-visible light sources, especially by a technically mature blue light source to generate red light and near-infrared light with a high-intensity wide spectrum or multiple spectra; and a device which is based on a single excitation light source, has simple package forms and can generate red light and near-infrared light with a wide spectrum or multiple spectra, as well as a light-emitting device which is based on a single excitation light source, has simple package forms and meanwhile, can achieve compensation for white light and near-infrared light.

Therefore, it is very necessary to develop a light-emitting material that can be excited by a variety of light sources/bands, especially by blue light, and that has a high luminescent intensity and can generate red light and near-infrared light with a wide spectrum or multiple spectra. This material is used to manufacture fluorescent-converted LED devices, which are applied in such fields as security monitoring, biometric identification, 3D sensing, food/medical detection. Also, this material is used to manufacture a light-emitting device which integrates white light and infrared light, which reduces the packaging cost, simplifies the packaging process, improves a display effect, and serves for the field of security monitoring.

SUMMARY

(1) Objectives of the Invention

The problem to be solved by the embodiments of the present invention is to overcome the defects of the above-mentioned light-emitting materials. One of the objectives of the present invention is to obtain a red light and near-infrared light-emitting material. Compared with the existing red light and near-infrared light-emitting materials, this material may be excited by a spectrum with a wide wavelength range (ultraviolet-visible light) to generate near-infrared light with a wide spectrum or multiple spectra. Furthermore, another objective of the embodiment of the present invention is to provide a light-emitting device based on a mature chip to realize the integration of white light and near-infrared light. The optical device greatly simplifies the packaging process, reduces the packaging cost, and is capable of meeting the requirements for practical application of near-infrared light sources in the emerging field of security monitoring.

(II) Technical Solutions

A first aspect of the embodiment of the present invention provides a red light and near-infrared light-emitting material. The light-emitting material contains a compound represented by a molecular formula $xA_2O_3 \cdot yIn_2O_3 \cdot bR_2O_3$, wherein the element A is Sc and/or Ga; the element R is one or two of Cr, Yb, Nd or Er and necessarily includes Cr; and $0.001 \leq x \leq 1$, $0.001 \leq y \leq 1$, $0.001 \leq b \leq 0.2$, and $0.001 \leq b/(x+y) \leq 0.2$.

Further, the compound has a crystal structure which is the same as $\beta\text{-}Ga_2O_3$.

Further, the element A is Ga.

Further, $0.001 \leq y/x \leq 0.65$.

Further, the element A is Sc and Ga, and $0.001 \leq y/x \leq 0.65$.

Furthermore, $0.001 \leq y/x \leq 0.4$.

Further, a molar ratio of Ge to Sc in the element A is M, where $1 \leq M \leq 3$.

A second aspect of the embodiment of the present invention provides a light-emitting device which at least includes an excitation light source and a light-emitting material, wherein the light-emitting material at least includes the aforementioned red light and near-infrared light-emitting material.

Further, peak luminous wavelengths of the excitation light source range from 400 nm to 500 nm and from 550 nm to 700 nm, preferably from 420 nm to 700 nm.

Further, the light-emitting device includes a blue-light LED chip, and the light-emitting material further includes one, or two or more of visible light phosphors whose molecular formulas are $La_3Si_6Ni:Ce$, $Y_3Al_5O_{12}:Ce$, Ca-α-Sialon:Eu,$(Y,Lu)_3(Al,Ga)_5O_{12}:Ce$, $(Sr, Ca)_2SiO_4$: Eu, β-Sialon:Eu, (Ca, Sr) $AlSiN_3$: Eu, $Sr_2Si_5N_8$: Eu, and (Sr, Ca)S: Eu.

(III) Beneficial Effects

The above technical solutions of the embodiments of the present invention have the following beneficial technical effects.

1. The embodiment of the present invention provides a material that can be excited by ultraviolet-visible light to generate red light and near-infrared light with a high-intensity wide spectrum or multiple spectra, and a light-emitting device. The spectrum can be controlled and tuned by changing components. The light-emitting material can be excited by a technically mature blue light source to generate light with a high-intensity wide-spectrum or multiple spectra.

2. The light-emitting device uses the LED chip to combine the infrared light-emitting material and the visible light-emitting material. In this way, the same LED chip can emit near-infrared light and visible light at the same time, which greatly simplifies the packaging process and reduces the packaging cost.

DETAILED DESCRIPTION

Figure 1:
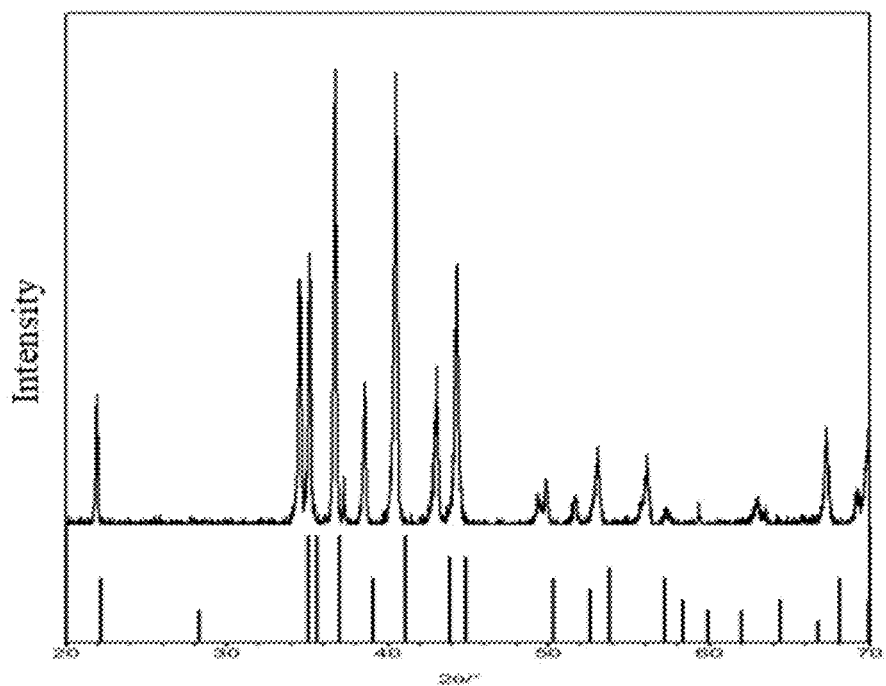
FIG. 1 shows an X-ray diffraction pattern of a light-emitting material obtained in Embodiment 1 of the present invention.

For clearer description of the objectives, technical solutions, and advantages of the embodiments of the present invention, the embodiments of the present invention will be further described in detail below in combination with specific implementations and with reference to the accompanying drawings. It should be understood that these description are only exemplary and not intended to limit the scope of the embodiments of the present invention. In addition, in the following description, the description of well-known structures and technologies is omitted to avoid unnecessary confusion of the concepts in the embodiments of the present invention.

A first aspect of the embodiment of the present invention provides a red light and near-infrared light-emitting material. The light-emitting material contains a compound represented by a molecular formula, $xA_2O_3 \cdot yIn_2O_3 \cdot bR_2O_3$, wherein the element A is Sc and/or Ga; the element R is one or two of Cr, Yb, Nd or Er and necessarily includes Cr; and $0.001 \leq x \leq 1$, $0.001 \leq y \leq 1$, $0.001 \leq b \leq 0.2$, and $0.001 \leq b/(x+y) \leq 0.2$.

The element R is a luminescent center of the light-emitting material according to the embodiment of the present invention. When the compositions of the luminescent centers range from 0.001 and 0.2, the light-emitting material according to the embodiment of the present invention has an optimal luminescent intensity. In the case of $b/(x+y)<0.001$, the luminescent intensity is low because there are too few luminescent centers. In the case of $b/(x+y)>0.2$, the concentration of the luminescent centers is too high, which will cause concentration quenching, thus also reducing the luminescent intensity.

Preferably, the compound, $xA_2O_3 \cdot yIn_2O_3 \cdot bR_2O_3$, has a crystal structure which is the same as β-$Ga_2O_3$. $Ga_2O_3$ has five isomers such as α, β, and γ. Among them, β-$Ga_2O_3$ is the most stable, and has a monoclinic crystal structure and the characteristics of stable chemical properties and easy doping of cations. In the embodiment of the present invention, $In_2O_3$ may realize the emission of red light and near-infrared light by introducing transition metal and rare earth metal ions. In addition, the spectrum can be adjusted and controlled by a substitution of other congeners.

Preferably, the element A is Ga, and the radius of Ga is smaller than that of In, so that lattices shrink, the length of a bond between an ion in the luminescent center and an oxygen ion is shortened, which makes the crystal field intensity becomes higher. As the relative content of Ga and In changes, peak positions and intensities of an emission spectrum of luminescent ions are adjusted. More preferably, in the red light and near-infrared light-emitting material, $0.001 \leq y/x \leq 0.65$, and within the composition range, the light-emitting material of the present invention has an optimal luminescent intensity.

Preferably, the element A is Ga and Sc, and $0.001 \leq y/x \leq 0.65$.

Further preferably, $0.001 \leq y/x \leq 0.4$.

More preferably, a molar ratio of Ga to Sc is M, and $1 \leq M \leq 3$. When the element A contains both Ga and Sc, the relative content thereof can be adjusted to adjust the spectral positions of the luminescent ions and optimize the luminescent efficiency. When M is less than 1, the luminescent intensity is low; and when M is greater than 3, it is possible to generate an impurity phase.

The red light and near-infrared light-emitting material according to the embodiment of the present invention is characterized in that $In_2O_3$ is doped with Sc and/or Ga. The atomic radius of Sc is larger than that of In, and the atomic radius of Ga is smaller than that of In, such that In cation is replaced, resulting in expansion or shrinkage of lattices of In-containing oxide and a change in the length of a bond between Cr ion and O anion in the luminescent center, thereby causing a change in the intensity of the crystal field, and realizing wide-spectrum or multi-spectrum emission of Cr ions. As the content of doped Sc and/or Ga ions increases, the spectrum moves. The peak wavelength of wide-spectrum emission can be controlled and tuned at 730 nm to 870 nm, and the most intensive luminescent position of the multi-spectrum emission is at 1550 nm.

Compared with the prior art, the beneficial effects of the light-emitting material of the embodiment of the present invention are as follows.

1. The embodiment of the present invention provides a material and a light-emitting device that can be excited by ultraviolet-visible light to generate red light and near-infrared light with a high-intensity wide spectrum or multiple spectra, and the spectrum can be controlled and tuned by changing the composition.

2. The light-emitting material can be excited by a technically mature blue light source to emit light with a high-intensity wide spectrum or multiple spectra, which has a higher luminescent intensity than existing materials.

A preparation method for the red light and near-infrared light-emitting material according to the embodiment of the present invention is as follows: according to the stoichiometric ratio of the chemical formula, the raw materials such as oxides containing elements A, In, and R, salts and elementary substances are accurately weighed; the raw materials are ground and mixed evenly and placed into a crucible; then sintered in a high-temperature furnace at 1300° C. to 1500° C. for 2 hours to 10 hours under the protective atmosphere of air or nitrogen; and then cooled to room temperature with the furnace; and the sample is ball-milled, washed with water and sieved to obtain the red light and near-infrared light-emitting material.

A second aspect of the embodiment of the present invention provides a light-emitting device. The light-emitting device can be manufactured with the red light and near-infrared light-emitting material described in any one of the embodiments of the present invention in combination with an excitation light source. Preferably, peak luminous wavelengths of the excitation light source of the light-emitting device range from 400 nm to 500 nm and from 550 nm to 700 nm, preferably from 420 nm to 470 nm.

Preferably, the light-emitting device includes a blue-light LED chip, the aforementioned red light and near-infrared light-emitting material, and one, or two or more visible light phosphors whose molecular formulas are $La_3Si_6Ni:Ce$, $Y_3Al_5O_{12}:Ce$, Ca-α-Sialon:Eu, $(Y, Lu)_3(Al, Ga)_5O_{12}:Ce$, $(Sr, Ca)_2SiO_4:Eu$, β-Sialon:Eu, $(Ca, Sr)AlSiN_3:Eu$, $Sr_2Si_5N_8:Eu$, and $(Sr,Ca)S:Eu$.

Compared with the prior art, the beneficial effects of the light-emitting device of the embodiment of the present invention are as follows.

1. The light-emitting device uses the LED chip to combine the infrared light-emitting material and the visible light-emitting material. In this way, the same LED chip can emit near-infrared light and visible light at the same time, which greatly simplifies the packaging process and reduces the packaging cost.

2. The light-emitting device has the characteristics such as high luminescence efficiency/excellent reliability, strong anti-interference ability, and white light compensation, has a peak wavelength of wide-spectrum emission at 730 nm to 870 nm, and has a good application prospect in the security field.

In order to further explain the present invention, the red light and near-infrared light-emitting material and the light-emitting device provided by the present invention will be described in detail below in combination with embodiments. However, it should be understood that these embodiments are implemented on the premise of the technical solutions of the present invention. The detailed implementations and specific operation procedures are provided to further explain the features and advantages of the embodiments of the present invention, but not to limit the claims of the present invention. The protection scope of the embodiments of the present invention is not limited to the following embodiments.

The devices and reagents used in the following embodiments are commercially available.

Embodiment 1

According to the stoichiometric ratio of the chemical formula $Ga_2O_3 \cdot 0.3In_2O_3 \cdot 0.05Cr_2O_3$, raw materials $Ga_2O_3$, $In_2O_3$ and $Cr_2O_3$ are accurately weighed. And then, the raw materials are ground and mixed evenly and placed into a crucible. The raw materials are sintered in a high-temperature furnace at 1450° C. for 8 hours in air and cooled to room temperature in the furnace. After the sample is ball-milled, washed with water and sieved, the red light and near-infrared light-emitting material of Embodiment 1 is obtained. The light-emitting material obtained in Embodiment 1 is analyzed by X-ray diffraction to obtain an X-ray diffraction pattern thereof, as shown in FIG. 1.

Figure 2:
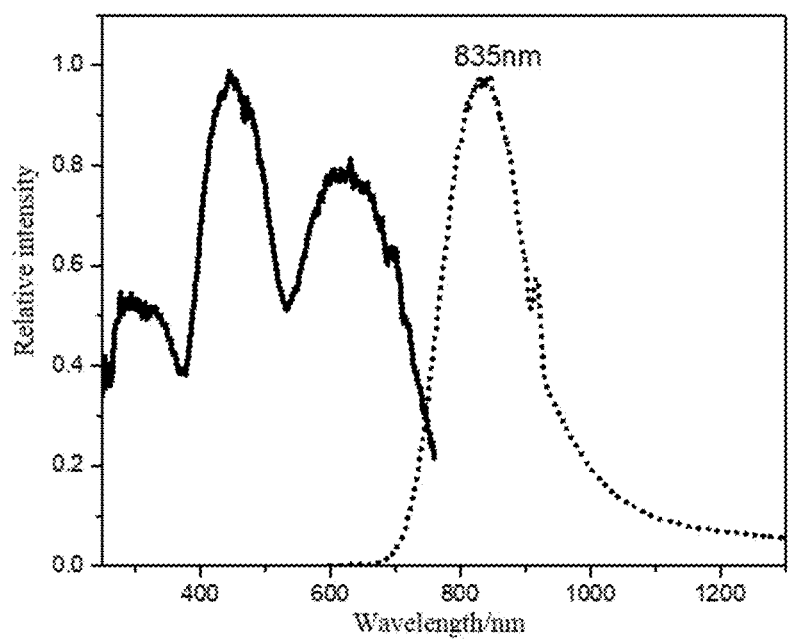
FIG. 2 shows a luminescence spectrum diagram of the light-emitting material obtained in Embodiment 1 of the present invention.
Figure 3:
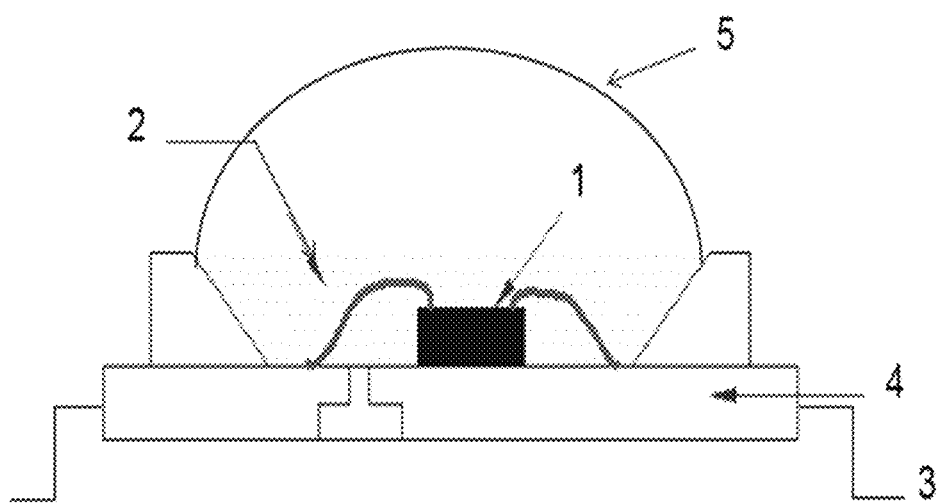
FIG. 3 shows a schematic structural diagram of the light-emitting device in the embodiment of the present invention.

The light-emitting material obtained in Embodiment 1 is analyzed with a fluorescence spectrometer, and a luminescent spectrum is obtained by the excitation of blue light at 460 nm. The material achieves wide-spectrum light emission of a red light and near-infrared spectrum under the excitation of blue light, which has a peak wavelength of 838 nm. An excitation spectrum of the material is obtained by monitoring the light emission at 838 nm, as shown in FIG. 2. It can be seen that the light-emitting material can be effectively excited by ultraviolet light, purple light, blue light and red light, and emits red light and near-infrared wide spectra.

Embodiment 2

According to the stoichiometric ratio of the chemical formula $Ga_2O_3 \cdot 0.4In_2O_3 \cdot 0.04Cr_2O_3$, raw materials $Ga(NO_3)_3$, $In_2O_3$ and $Cr_2O_3$ are accurately weighed. And then, the raw materials are ground and mixed evenly and placed into a crucible. The raw materials are sintered in a high-temperature furnace at 1450° C. for 8 hours in air and cooled to room temperature in the furnace. After the sample is ball-milled, washed with water and sieved, the red light and near-infrared light-emitting material of Embodiment 2 is obtained.

The light-emitting material obtained in Embodiment 2 is analyzed with a fluorescence spectrometer, and a luminescent spectrum is obtained by the excitation of blue light at 460 nm. The material achieves wide-spectrum light emission of a red light and near-infrared spectrum under the excitation of blue light, which has a peak wavelength of 850 nm. The light-emitting material can be effectively excited by purple light, blue light and red light to emit red light and near-infrared wide spectra.

Embodiment 3

According to the stoichiometric ratio of the chemical formula $(Sc_{0.25}Ga_{0.75})_2O_3 \cdot 0.1In_2O_3 \cdot 0.04Cr_2O_3$, raw materials $Ga_2O_3, In_2O_3$ and $Cr_2O_3$ are accurately weighed. And then, the raw materials are ground and mixed evenly and placed into a crucible. The raw materials are sintered in a high-temperature furnace at 1450° C. for 8 hours in air and cooled to room temperature in the furnace. After the sample is ball-milled, washed with water and sieved, the red light and near-infrared light-emitting material of Embodiment 3 is obtained.

The light-emitting material obtained in Embodiment 3 is analyzed with a fluorescence spectrometer, and a luminescent spectrum is obtained by the excitation of blue light at 460 nm. The material achieves wide-spectrum light emission of a red light and near-infrared spectrum under the excitation of blue light, which has a peak wavelength of 830 nm. The light-emitting material can be effectively excited by purple light, blue light and red light to emit red light and near-infrared wide spectra.

For the red light and near-infrared light-emitting materials described in Embodiments 4 to 25, the chemical formulas of the compounds are listed in Table 1. The preparation method for the material in each of respective embodiments is the same as that in Embodiment 1: the compounds with appropriate stoichiometric ratios are selected just according to the compositions of chemical formulas of the target compounds in each embodiment to be mixed, ground and sintered under appropriate conditions to obtain the desired near-infrared light-emitting material.

The performances of the light-emitting materials prepared in respective embodiment are tested. The light-emitting properties in test results of Embodiments 1 to 25 excited at 460 nm are shown in Table 1 below.

TABLE 1

Performance test table of light-emitting materials

| No. | Molecular formula/Material | Peak position (nm) | Half-peak width (nm) |
|---|---|---|---|
| Embodiment 1 | $Ga_2O_3 \cdot 0.3In_2O_3 \cdot 0.05Cr_2O_3$ | 838 | 150 |
| Embodiment 2 | $Ga_2O_3 \cdot 0.4In_2O_3 \cdot 0.04Cr_2O_3$ | 850 | 148 |
| Embodiment 3 | $(Sc_{0.25}Ga_{0.75})_2O_3 \cdot 0.1In_2O_3 \cdot 0.04Cr_2O_3$ | 830 | 149 |
| Embodiment 4 | $0.001Ga_2O_3 \cdot In_2O_3 \cdot 0.04Cr_2O_3$ | 870 | 152 |
| Embodiment 5 | $Ga_2O_3 \cdot 0.65In_2O_3 \cdot 0.04Cr_2O_3$ | 857 | 147 |
| Embodiment 6 | $Ga_2O_3 \cdot 0.001In_2O_3 \cdot 0.2Cr_2O_3$ | 732 | 146 |
| Embodiment 7 | $Ga_2O_3 \cdot 0.3In_2O_3 \cdot 0.001Cr_2O_3$ | 840 | 150 |
| Embodiment 8 | $Ga_2O_3 \cdot 0.3In_2O_3 \cdot 0.04Cr_2O_3$ | 840 | 150 |
| Embodiment 9 | $Ga_2O_3 \cdot 0.48In_2O_3 \cdot 0.04Cr_2O_3$ | 855 | 149 |
| Embodiment 10 | $Ga_2O_3 \cdot 0.14In_2O_3 \cdot 0.04Cr_2O_3$ | 808 | 147 |
| Embodiment 11 | $0.5Ga_2O_3 \cdot 0.1In_2O_3 \cdot 0.04Cr_2O_3$ | 827 | 148 |
| Embodiment 12 | $0.8Ga_2O_3 \cdot 0.1In_2O_3 \cdot 0.04Cr_2O_3$ | 845 | 147 |
| Embodiment 13 | $(Sc_{0.333}Ga_{0.667})_2O_3 \cdot 0.15In_2O_3 \cdot 0.04Cr_2O_3$ | 852 | 149 |
| Embodiment 14 | $(Sc_{0.5}Ga_{0.5})_2O_3 \cdot 0.2In_2O_3 \cdot 0.04Cr_2O_3$ | 860 | 153 |
| Embodiment 15 | $Ga_2O_3 \cdot In_2O_3 \cdot 0.04Cr_2O_3$ | 869 | 153 |
| Embodiment 16 | $(Sc_{0.3}Ga_{0.7})_2O_3 \cdot 0.4In_2O_3 \cdot 0.04Cr_2O_3$ | 855 | 150 |
| Embodiment 17 | $(Sc_{0.25}Ga_{0.75})_2O_3 \cdot 0.4In_2O_3 \cdot 0.04Cr_2O_3$ | 848 | 150 |
| Embodiment 18 | $(Sc_{0.001}Ga_{0.999})_2O_3 \cdot 0.6In_2O_3 \cdot 0.04Cr_2O_3$ | 868 | 152 |
| Embodiment 19 | $(Sc_{0.001}Ga_{0.999})_2O_3 \cdot 0.001In_2O_3 \cdot 0.04Cr_2O_3$ | 735 | 148 |
| Embodiment 20 | $(Sc_{0.333}Ga_{0.667})_2O_3 \cdot 0.15In_2O_3 \cdot 0.04(Cr_{0.5}Yb_{0.5})_2O_3$ | 810/1000 | 33(1000) |
| Embodiment 21 | $(Sc_{0.333}Ga_{0.667})_2O_3 \cdot 0.15In_2O_3 \cdot 0.04(Cr_{0.5}Nd_{0.5})_2O_3$ | 810/1000 | 33(1000) |
| Embodiment 22 | $(Sc_{0.333}Ga_{0.667})_2O_3 \cdot 0.15In_2O_3 \cdot 0.04(Cr_{0.5}Er_{0.5})_2O_3$ | 815/1550 | 157(815) 31(1550) |
| Embodiment 23 | $(Sc_{0.24}Ga_{0.76})_2O_3 \cdot 0.1In_2O_3 \cdot 0.04Cr_2O_3$ | 842 | 149 |
| Embodiment 24 | $Sc_2O_3 \cdot In_2O_3 \cdot 0.2Cr_2O_3$ | 870 | 153 |
| Embodiment 25 | $0.88(Sc_{0.1}Ga_{0.9})_2O_3 \cdot 0.001In_2O_3 \cdot 0.04Cr_2O_3$ | 790 | 148 |

It can be seen from Table 1 that the light-emitting material according to the embodiment of the present invention has the characteristics of wide-spectrum emission or multi-spectrum emission of red light and near-infrared light under the excitation of the blue light.

The red light and near-infrared light-emitting material according to the embodiment of the present invention is used to manufacture a light-emitting device, the structure of which is shown in FIG. 2. The light-emitting device includes a semiconductor chip 1 on a base 4, glue and a light-emitting material 2 which are filled around the semiconductor chip 1, a plastic lens 5 covering the semiconductor chip 1, the glue and light-emitting material 2, and a pin 3. The specific embodiments are as follows.

Embodiment 26

A light-emitting device is composed of a blue-light LED chip having a wavelength of 458 nm and a far-light and near-infrared light-emitting material whose molecular formula is $Ga_2O_3 \cdot 0.4In_2O_3 \cdot 0.04Cr_2O_3$ according to the embodiment of the present invention. The light-emitting material according to the embodiment of the present invention is uniformly fixed in silica gel, and then coated onto the LED chip to obtain the light-emitting device.

Embodiment 27

A light-emitting device is composed of a blue-light LED chip having a wavelength of 458 nm, a far-light and near-infrared light-emitting material whose molecular formula is $Ga_2O_3 \cdot 0.4In_2O_3 \cdot 0.04Cr_2O_3$ according to the embodiment of the present invention, and a yellow light-emitting material whose visible light light-emitting material is $La_3Si_6Nr:Ce^{3+}$, wherein a mass ratio of the visible light light-emitting material to the near-infrared light-emitting material according to the embodiment of the present invention is 1:1; and the two light-emitting materials are uniformly mixed in the silica gel, and further coated onto the LED chip to obtain the light-emitting device, wherein a weight ratio of the two light-emitting materials in the silica gel is 60%.

Embodiment 28

A light-emitting device is composed of a blue LED chip having a wavelength of 458 nm, a far-light and near-infrared light-emitting material whose molecular formula is $(Sc_{0.25}Ga_{0.75})_2O_3 \cdot 0.1In_2O_3 \cdot 0.04Cr_2O_3$ according to the embodiment of the present invention, a yellow light-emitting material whose visible light light-emitting material is $La_3Si_6N_{11}:Ce^{3+}$, and a red light-emitting material whose molecular formula is $(Ca, Sr) AlSiN_3:Eu$, wherein a mass ratio of the visible light-emitting material to the near-infrared light-emitting material according to the embodiment of the present invention is 1:1. The two light-emitting materials are uniformly mixed in the silica gel, and further coated on the LED chip to obtain the light-emitting device, wherein a weight ratio of the two light-emitting materials in the silica gel is 70%.

The compositions of the light-emitting materials of the light-emitting devices described in Embodiments 29 to 38 are listed in Table 2. The structures of the light-emitting devices in various embodiments are the same as those in Embodiments 26 to 28. The light-emitting material can be obtained just by mixing light-emitting materials in accordance with their molecular formulas in each embodiment and their ratios.

The performances of the light-emitting devices manufactured in various embodiment are tested. The light-emitting properties in test results of Embodiments 26 to 38 are shown in Table 2.

and a light-emitting device including the light-emitting material. The red light and near-infrared light-emitting material contains a compound represented by a molecular formula, $xA_2O_3 \cdot yIn_2O_3 \cdot bR_2O_3$, wherein the element A is Sc and/or Ga; the element R is one or two of Cr, Yb, Nd and Er and necessarily includes Cr; and $0.001 \leq x \leq 1$, $0.001 \leq y \leq 1$, $0.001 \leq b \leq 0.2$, and $0.001 \leq b/(x+y) \leq 0.2$. The light-emitting material can be excited by a technically mature blue light source to emit light with a high-intensity wide-spectrum or multiple spectra, which has higher luminescent intensity than existing materials. The light-emitting device uses the LED chip to combine the infrared light-emitting material and the visible light light-emitting material. In this way, the same LED chip can emit near-infrared light and visible light at the same time, which greatly simplifies the packaging process and reduces the packaging cost.

TABLE 2

Light-emitting performance test table of light-emitting devices

| Name | LED chip Peak wavelength/nm | Infrared light-emitting material Molecular formula | Visible light light-emitting material Molecular formula | Total mass ratio of infrared material to light-emitting material | Infrared peak wavelength/nm |
|---|---|---|---|---|---|
| Embodiment 26 | 455 nm | $Ga_2O_3 \cdot 0.4In_2O_3 \cdot 0.04Cr_2O_3$ | | | 850 |
| Embodiment 27 | 455 nm | $Ga_2O_3 \cdot 0.4In_2O_3 \cdot 0.04Cr_2O_3$ | $La_3Si_6N_{11}:Ce^{3+}$ | 60% | 850 |
| Embodiment 28 | 455 nm | $(Sc_{0.25}Ga_{0.75})_2O_3 \cdot 0.1In_2O_3 \cdot 0.04Cr_2O_3$ | $La_3Si_6N_{11}:Ce$, $(Ca,Sr)AlSiN_3:Eu$ | 60% | 830 |
| Embodiment 29 | 455 nm | $(Sc_{0.3}Ga_{0.7})_2O_3 \cdot 0.4In_2O_3 \cdot 0.04Cr_2O_3$ | $Lu_3Al_5O_{12}:Ce^{3+}$ | 55% | 855 |
| Embodiment 30 | 455 nm | $Ga_2O_3 \cdot 0.3In_2O_3 \cdot 0.001Cr_2O_3$ | $Lu_3(Al,Ga)_5O_{12}:Ce^{3+}$ $(Sr,Ca)AlSiN_3:Eu^{2+}$ $Y_3Al_5O_{12}:Ce^{3+}$ | 55% | 838 |
| Embodiment 31 | 455 nm | $Ga_2O_3 \cdot 0.14In_2O_3 \cdot 0.04Cr_2O_3$ | $Gd_3Al_5O_{12}:Ce^{3+}$ | 65% | 810 |
| Embodiment 32 | 420 nm | $0.88(Sc_{0.1}Ga_{0.9})_2O_3 \cdot 0.00In_2O_3 \cdot 0.04Cr_2O_3$ | $Y_3(Al,Ga)_5O_{12}:Ce^{3+}$ | 80% | 790 |
| Embodiment 33 | 470 nm | $(Sc_{0.24}Ga_{0.76})_2O_3 \cdot 0.1In_2O_3 \cdot 0.04Cr_2O_3$ | $Lu_3(Al,Ga)_5O_{12}:Ce^{3+}$ | 60% | 842 |
| Embodiment 34 | 460 nm | $(Sc_{0.25}Ga_{0.75})_2O_3 \cdot 0.4In_2O_3 \cdot 0.04Cr_2O_3$ | $Lu_3(Al,Ga)_5O_{12}:Ce^{3+}$ | 80% | 858 |
| Embodiment 35 | 455 nm | $(Sc_{0.333}Ga_{0.667})_2O_3 \cdot 0.15In_2O_3 \cdot 0.04(Cr_{0.5}Yb_{0.5})_2O_3$ | $La_3Si_6N_{11}:Ce^{3+}$ β-Sialon:Eu, | 55% | 810/1000 |
| Embodiment 36 | 455 nm | $(Sc_{0.333}Ga_{0.667})_2O_3 \cdot 0.15In_2O_3 \cdot 0.04(Cr_{0.5}Nd_{0.5})_2O_3$ | $Y_3Al_5O_{12}:Ce^{3+}$ $(Sr,Ca)AlSiN_3:Eu^{2+}$ | 55% | 810/1000 |
| Embodiment 37 | 455 nm | $(Sc_{0.333}Ga_{0.667})_2O_3 \cdot 0.15In_2O_3 \cdot 0.04(Cr_{0.5}Er_{0.5})_2O_3$ | $La_3Si_6N_{11}:Ce^{3+}$ $(Ca,Sr,Ba)_2Si_5N_8:Eu^{2+}$ | 65% | 815/1550 |
| Embodiment 38 | 455 nm | $Ga_2O_3 \cdot 0.48In_2O_3 \cdot 0.04Cr_2O_3$ | $La_3Si_6N_{11}:Ce^{3+}$ $(Sr,Ca)AlSiN_3:Eu^{2+}$ | 48% | 857 |

It can be seen from Table 2 that the light-emitting device according to the embodiment of the present invention can easily realize the emission of white light and near-infrared light simultaneously by a blue light chip and simultaneously combining visible light and near-infrared light-emitting materials. Compared with the way of realizing the integration of white light and infrared light by combining a white LED and an infrared chip lamp bead, a packaging method for packaging the device according to the embodiment of the present invention is simpler. In addition, since the cost of the blue light chip is one tenth of that of an infrared chip, the cost is greatly reduced.

In summary, the embodiments of the present invention provide a red light and near-infrared light-emitting material It should be understood that the aforementioned specific embodiments of the present invention are only used as examples to illustrate or explain the principles of the embodiments of the present invention, and do not constitute a limitation to the embodiments of the present invention. Therefore, any modifications, equivalent substitutions or improvements that are made within the spirit and scope of the embodiments of the present invention should all be included in the protection scope of the embodiments of the present invention. In addition, the appended claims of the embodiments of the present invention are intended to cover all changes and modifications that fall within the scope and boundary of the appended claims, or equivalent forms of such scope and boundary.

The invention claimed is:

1. A red light and near-infrared light-emitting material, containing a compound represented by a molecular formula, $xA_2O_3 \cdot yIn_2O_3 \cdot bR_2O_3$, wherein the element A is Sc and Ga; the element R is one or two of Cr, Yb, Nd or Er and necessarily comprises Cr; and $0.001 \leq x \leq 1$, $0.001 \leq y \leq 1$, $0.001 \leq b \leq 0.2$, and $0.001 \leq b/(x+y) \leq 0.2$, $0.001 \leq y/x \leq 0.65$.

2. The red light and near-infrared light-emitting material according to claim 1, wherein the compound has a crystal structure which is the same as $\beta$-$Ga_2O_3$.

3. The red light and near-infrared light-emitting material according to claim 1, wherein, $0.001 \leq y/x \leq 0.4$.

4. The red light and near-infrared light-emitting material according to claim 1, wherein a molar ratio of Ga to Sc in the element A is M, where $1 \leq M \leq 3$.

5. A light-emitting device, at least comprising an excitation light source and a light-emitting material, wherein the light-emitting material at least comprises the red light and near-infrared light-emitting material according to claim 1.

6. The light-emitting device according to claim 5, wherein peak luminous wavelengths of the excitation light source range from 400 nm to 500 nm and from 550 nm to 700 nm.

7. The light-emitting device according to claim 6, wherein the light-emitting device comprises a blue-light LED chip, and the light-emitting material further contains one, or two or more of visible light phosphors whose molecular formulas are $La_3Si_6N_{11}$:Ce, $Y_3Al_5O_{12}$:Ce, Ca-$\alpha$-Sialon:Eu, (Y, Lu)$_3$(Al, Ga)$_5O_{12}$:Ce, (Sr, Ca)$_2SiO_4$:Eu, $\beta$-Sialon:Eu, (Ca, Sr)AlSiN$_3$:Eu, Sr$_2$Si$_5$N$_8$:Eu, and (Sr, Ca)S:Eu.

8. The red light and near-infrared light-emitting material according to claim 3, wherein a molar ratio of Ga to Sc in the element A is M, where $1 \leq M \leq 3$.

9. A light-emitting device, at least comprising an excitation light source and a light-emitting material, wherein the light-emitting material at least comprises the red light and near-infrared light-emitting material according to claim 2.

10. A light-emitting device, at least comprising an excitation light source and a light-emitting material, wherein the light-emitting material at least comprises the red light and near-infrared light-emitting material according to claim 3.

11. A light-emitting device, at least comprising an excitation light source and a light-emitting material, wherein the light-emitting material at least comprises the red light and near-infrared light-emitting material according to claim 4.

12. The light-emitting device according to claim 6, wherein peak luminous wavelengths of the excitation light source range from 420 nm to 700 nm.

13. The light-emitting device according to claim 12, wherein the light-emitting device comprises a blue-light LED chip, and the light-emitting material further contains one, or two or more of visible light phosphors whose molecular formulas are $La_3Si_6Ni$:Ce, $Y_3Al_5O_{12}$:Ce, Ca-$\alpha$-Sialon:Eu,(Y,Lu)$_3$(Al,Ga)$_5O_{12}$:Ce, (Sr, Ca)$_2SiO_4$: Eu, $\beta$-Sialon:Eu, (Ca, Sr) AlSiN$_3$: Eu, Sr$_2$Si$_5$Ns: Eu, and (Sr, Ca)S: Eu.

* * * * *